(12) United States Patent
Siedentopf et al.

(10) Patent No.: US 12,055,558 B2
(45) Date of Patent: Aug. 6, 2024

(54) HOUSING AND METHOD FOR CASTING AN OPEN RECEIVING CHAMBER OF A HOUSING

(71) Applicant: Robert Bosch GmbH, Stuttgart (DE)

(72) Inventors: Joerg Siedentopf, Untergruppenbach (DE); Thomas Breinlinger, Immenstadt (DE)

(73) Assignee: Robert Bosch GmbH, Stuttgart (DE)

( * ) Notice: Subject to any disclaimer, the term of this patent is extended or adjusted under 35 U.S.C. 154(b) by 198 days.

(21) Appl. No.: 17/797,089

(22) PCT Filed: Jan. 21, 2021

(86) PCT No.: PCT/EP2021/051312
§ 371 (c)(1),
(2) Date: Aug. 2, 2022

(87) PCT Pub. No.: WO2021/156068
PCT Pub. Date: Aug. 12, 2021

(65) Prior Publication Data
US 2023/0052741 A1    Feb. 16, 2023

(30) Foreign Application Priority Data
Feb. 7, 2020    (DE) ............ 10 2020 201 493.0

(51) Int. Cl.
*H05K 5/06*    (2006.01)
*G01P 1/02*    (2006.01)

(52) U.S. Cl.
CPC .............. *G01P 1/026* (2013.01); *H05K 5/064* (2013.01); *H05K 5/069* (2013.01)

(58) Field of Classification Search
CPC ....................................................... H05K 7/00
See application file for complete search history.

(56) References Cited

U.S. PATENT DOCUMENTS

2008/0198559 A1*  8/2008  Mueller ............... H01R 43/24
361/728

FOREIGN PATENT DOCUMENTS

DE           197 55 734 A1    6/1999
DE     10 2008 042 489 B4    4/2010
(Continued)

OTHER PUBLICATIONS

International Search Report corresponding to PCT Application No. PCT/EP2021/051312, mailed Apr. 29, 2021 (German and English language document) (7 pages).

*Primary Examiner* — Jerry Wu
(74) *Attorney, Agent, or Firm* — Maginot, Moore & Beck LLP

(57) ABSTRACT

A housing with an open receiving chamber which has a circumferential edge in the form of a creepage barrier at an open upper face is disclosed. The receiving chamber is filled with a casting compound, and the hardened casting compound forms a concave surface relative to the circumferential edge at the open upper face. A sensor is also disclosed that includes such a housing. In addition, a method for casting an open receiving chamber of such a housing is disclosed. The open receiving chamber has an opening at one end leading to an enclosed interior adjoining the open receiving chamber. The enclosed interior is filled with the casting compound, and the open upper face of the receiving chamber has a varying height where the upper face transitions into the enclosed interior. The circumferential edge has an outwardly descending inclination and a continuous curvature formed by tangential transitions in order to overcome the height difference, and the circumferential edge allows the receiving chamber to be temporarily overfilled, thereby forming a stable convex casting compound surface, during the casting process.

10 Claims, 2 Drawing Sheets

(56) References Cited

FOREIGN PATENT DOCUMENTS

| | | |
|---|---|---|
| DE | 21 2013 000 297 U1 | 2/2016 |
| EP | 0 766 073 A1 | 4/1997 |
| EP | 2 667 090 A1 | 11/2013 |
| EP | 3 239 665 A1 | 11/2017 |

* cited by examiner

HOUSING AND METHOD FOR CASTING AN OPEN RECEIVING CHAMBER OF A HOUSING This application is a 35 U.S.C. § 371 National Stage Application of PCT/EP2021/051312, filed on Jan. 21, 2021, which claims the benefit of priority to Serial No. DE 10 2020 201 493.0, filed on Feb. 7, 2020 in Germany, the disclosures of which are incorporated herein by reference in their entirety.

The disclosure relates to a sensor having a housing and a method for potting an open receiving chamber of such a housing.

BACKGROUND

It is known from the prior art for electronic components to be potted using sealing compounds, for example epoxides or silicones, to protect against moisture, corrosion and electrical shunting. A current technique is therefore to fill an open receiving chamber in a housing, for example a sensor housing which receives electronic components of the sensor, with an epoxy resin potting compound or a silicone potting compound in order to protect against moisture, corrosion, electrical shunting, etc.

In particular, in the case of small sensors, for example a rotational speed sensor, the combination of the capillary action associated with small dimensions, a complex geometry and/or concave edges and a hydrophilic wetting behavior can cause the potting compound to run out during the potting process. This may result in the products and systems becoming contaminated with potting compound.

A workpiece composite for a pressure sensor is known from DE 10 2008 042 489 B4. The workpiece composite comprises a preform and a gel, which is received in a recess in the preform. The recess is enclosed by at least one edge as a creep barrier to prevent the gel from spreading. At least one surface, which is terminated by the edge, is provided with a coating of an oleophobic material in a region which adjoins the edge. The coating of oleophobic material prevents the gel from creeping on this surface.

SUMMARY

The housing having the features of independent claim 1 is advantageous in that the circumferential edge is suitable for also holding the potting compound in the defined region when an open upper side of the receiving chamber has different heights, which means that a height difference needs to be overcome. In this regard, as a result of the outward descending slope and as a result of the continuous curvature for overcoming the height difference, the circumferential edge prevents the potting compound from running out and the product and system from becoming contaminated. Moreover, a permissible temporary overfilling of the receiving chamber enables a stable and robust potting process with quicker cycle times and filling of an enclosed interior chamber which adjoins the open receiving chamber. Through the formation of the continuous curvature for overcoming the height difference, it is possible to reduce the risk of cracking which occurs in this region due to thermo-mechanical stresses or different thermal expansions of the potting compound. The continuous curvature of the edge for overcoming the height difference enables sufficient deformation of the potting compound and therefore counteracts cracking, leaks and corrosion. Moreover, as a result of the height difference at the end of the open receiving chamber, the formation of a higher and therefore larger opening or channel to the enclosed interior chamber is possible. The shear stress can be significantly reduced as a result of the larger opening or channel.

Exemplary embodiments of the inventive housing furthermore have a simple geometry in the region of the open receiving chamber, which geometry is easily transferrable to various design variants, which may differ in terms of housing length, housing width, the shape of the opening, or the number of electronic or electrical components to be received, for example. Moreover, the housing can be produced as a free-falling injection molded part.

Embodiments of the present disclosure provide a housing having an open receiving chamber, which has a circumferential edge as a creep barrier at an open upper side. The receiving chamber is filled with a potting compound, wherein the hardened potting compound forms a concave surface with respect to the circumferential edge at the open upper side. In this case, the open receiving chamber has, at one end, an opening to an enclosed interior chamber which adjoins the open receiving chamber. The enclosed interior chamber is filled with potting compound, and the open upper side of the receiving chamber has different heights at the transition to the enclosed interior chamber. The circumferential edge has an outward descending slope and, to overcome the height difference, a continuous curvature formed by tangential transitions, wherein the circumferential edge enables temporary overfilling of the receiving chamber during the potting process, thereby forming a stable convex potting compound surface.

A sensor having such a housing is furthermore proposed, in which at least one electronic or electrical component, for example a sensor element, a control and evaluation unit, etc. is arranged.

Moreover, a method for potting an open receiving chamber of such a housing is proposed. In this case, potting compound is added to the receiving chamber until the receiving chamber is full and a stable convex potting compound surface forms at a circumferential edge of the open upper side. The added potting compound is then hardened. Prior to hardening, the potting compound spreads into the enclosed interior chamber via the opening so that a concave potting compound surface forms at the circumferential edge of the open upper side of the receiving chamber.

In conventional housings which are known from the prior art and which have an open receiving chamber, a circumferential edge, which delimits the open upper side of the receiving chamber, does not have an outward descending slope. As a result, in the event of overfilling, the added potting compound forms an unstable convex potting compound surface, which, if a material-dependent contact angle is exceeded, runs out over the conventional edge and onto the adjacent surface of the receiving chamber so that the housing and the system may become contaminated. A fluid front or the projecting potting compound is maintained until the material-dependent contact angle with respect to the subsequent surface—the adjacent surface of the receiving chamber here—is achieved. This means that the conventional simple circumferential edge, which has an angle of 90° with respect to the adjacent surface, only holds the potting compound in the interior of the receiving chamber so long as the receiving chamber is not overfilled.

Embodiments of the housing can preferably be used with small rotational speed sensors. It goes without saying that embodiments of the housing can also be used for other small sensors or electrical or electronic circuits.

As a result of the features and developments presented in the dependent claims, advantageous improvements of the housing specified in independent claim 1 and the method for potting an open receiving chamber of such a housing, which is specified in independent claim 9, are possible.

It is particularly advantageous that edges of the receiving chamber can be designed to be rounded in the rising direction. In this regard, the receiving chamber can have a rectangular base area with rounded or concave corner regions, for example. As a result of the rounded portions formed in the rising direction of the potting compound, sharp edges, which might encourage the potting compound to run out during the potting process, are avoided.

In an advantageous configuration of the housing, the outward descending slope can have an angle of inclination in the range of 20° to 70°, and preferably an angle of inclination of 45°, for example. Moreover, the circumferential edge can have a height in the range of 0.1 to 1 mm.

In a further advantageous configuration of the housing, the receiving chamber and/or the interior chamber can receive at least one electronic or electrical component, which can be protected by the hardened potting compound. The at least one electronic or electrical component can be designed for example as a sensor element or as an ASIC component (ASIC: Application Specific Integrated Circuit) etc.

In a further advantageous configuration of the housing, for adaptation to various enclosed interior chambers which are to be filled with potting compound, the opening can be designed to be partially circular, and/or elliptical and/or stepped, or with another suitable shape.

In an advantageous configuration of the method, the added potting compound, after hardening, fills the enclosed interior chamber and forms a concave potting compound surface at the circumferential edge of the open upper side.

Exemplary embodiments of the disclosure are illustrated in the drawing and will be explained in more detail in the description below. In the drawing, the same reference signs denote components or elements which execute the same or similar functions.

DETAILED DESCRIPTION

Figure 1:
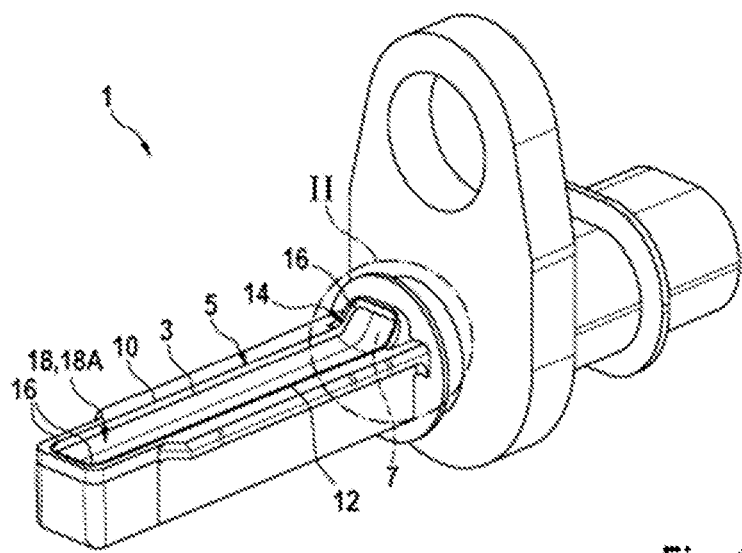
FIG. 1 shows a schematic perspective illustration of a rotational speed sensor with an exemplary embodiment of an inventive housing with potting compound which has been added to a receiving chamber.

As can be seen from FIGS. 1 to 5, the illustrated exemplary embodiment of an inventive housing 1 comprises an open receiving chamber 3 in each case, which has a circumferential edge 10 as a creep barrier at an open upper side 5. The receiving chamber 3 is filled with a potting compound 18, wherein the hardened potting compound 18 forms a concave surface 18A with respect to the circumferential edge 10 at the open upper side 5, as can be seen from FIGS. 1 and 5. In this case, the open receiving chamber 3 has, at one end, an opening 7 to an enclosed interior chamber 9 which adjoins the open receiving chamber 3. The enclosed interior chamber 9 is filled with potting compound 18 and the open upper side 5 of the receiving chamber 3 has different heights at the transition to the enclosed interior chamber 9, wherein the circumferential edge 10 has an outward descending slope 12 and, to overcome the height difference dh, a continuous curvature 14 formed by tangential transitions. The circumferential edge 10 enables temporary overfilling of the receiving chamber 3 during a potting process, thereby forming a stable convex potting compound surface 18B, as can be seen from FIG. 4.

Figure 2:
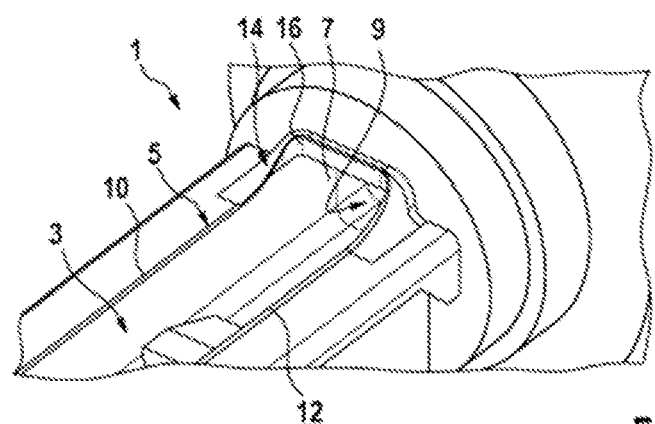
FIG. 2 shows a schematic perspective illustration of a detail II of the inventive housing of FIG. 1, without the added potting compound.
Figure 3:
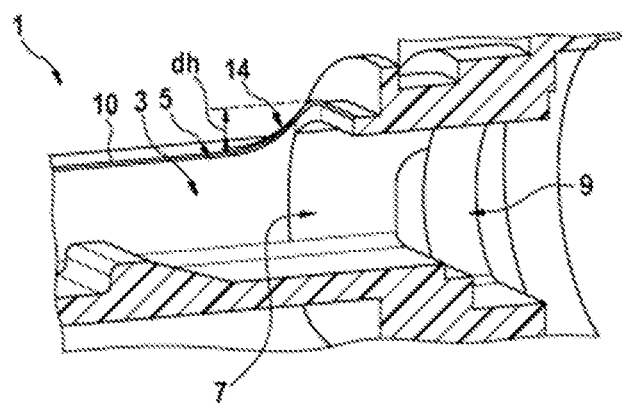
FIG. 3 shows a schematic perspective partial sectional illustration of a detail of the inventive housing of FIGS. 1 and 2.
Figures 4, 5:
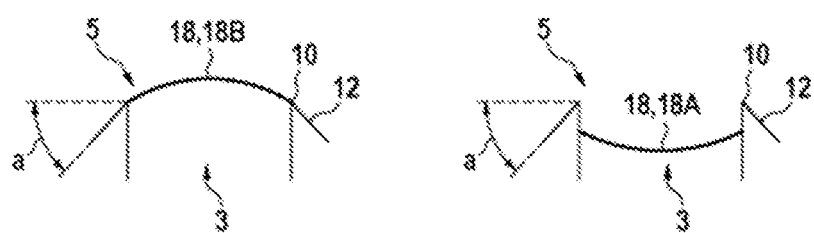
FIG. 4 shows a schematic cross-sectional illustration of an open receiving chamber of the inventive housing of FIGS. 1 to 3 after it has been filled with potting compound, which forms a stable convex potting compound surface.
FIG. 5 shows a schematic cross-sectional illustration of the open receiving chamber of the inventive housing of FIG. 4 after the hardening of the added potting compound, which forms a stable concave potting compound surface.

FIGS. 2 and 3 show the receiving chamber 3 prior to the potting process or prior to being filled with potting compound 18. FIGS. 1 and 5 shows the receiving chamber 3 after the hardening of the potting compound 18 to form a stable concave potting compound surface 18A. FIG. 4 shows a temporary overfilling of the receiving chamber 3 with potting compound 18 to form a stable convex potting compound surface 18B.

According to the disclosed method for potting an open receiving chamber 3 of such a housing 1, the potting compound 18 is added to the receiving chamber 3 until the receiving chamber 3 is full and a stable convex potting compound surface 18B (illustrated in FIG. 4) forms at the circumferential edge 10 of the open upper side 5. The potting compound 18 which has been added to the receiving chamber 3 then hardens. Prior to the hardening process, the added potting compound 18 spreads into the interior chamber 9 via the opening 7 until this interior chamber is filled with the potting compound 18, so that a concave potting compound surface 18A forms at the circumferential edge 10 of the open upper side 5 of the receiving chamber 3. In this case, the potting compound 18 also flows into cavities and undercuts (not illustrated) in the receiving chamber 3 and in the interior chamber 9. After the hardening procedure, the added potting compound 18 fills the enclosed interior chamber 9 and forms a concave potting compound surface 18A at the circumferential edge 10 of the open upper side 5 of the receiving chamber 3. In the illustrated exemplary embodiment, the opening 7 has a rectangular cross-section with rounded corners. It goes without saying that the opening 7 can also have another shape which is suitable for filling the enclosed interior chamber 9 with potting compound 18.

As can furthermore be seen from FIGS. 4 and 5, as a result of the outward descending slope, the circumferential edge 10 of the inventive housing 1 in the illustrated exemplary embodiment has an angle of inclination a in the range of 20° to 70° with respect to the subsequent surface—the slope 12 in this case. This enables overfilling of the receiving chamber 3 and the formation of the stable convex potting compound surface 18A during the potting process, without the potting compound 18 running out of the receiving chamber 3.

As can be seen in particular from FIGS. 1 and 2, edges of the receiving chamber 3 are designed to be rounded 16 in the rising direction. This avoids sharp edges in the receiving chamber 3, which would encourage the potting compound 18 to flow out of the receiving chamber 3 during the potting process.

As can furthermore be seen from FIGS. 1 to 3, the receiving chamber 3 in the illustrated exemplary embodiment of the housing 1 has a rectangular base area with rounded corner regions and, at one end, the opening 7 to the interior chamber 9. This means that the corner regions of the receiving chamber 3 are designed to be rounded 16.

Moreover, in addition to the rectangular base area, the receiving chamber 3 in exemplary embodiments of the housing 1 which are not illustrated can have a rounded indentation and/or a rounded protrusion at an end face and/or on a longitudinal side.

As can furthermore be seen from FIGS. 1 to 5, the outward descending slope 12 of the circumferential edge 10 in the illustrated exemplary embodiment of the housing 1 has, by way of example, an angle of inclination a of 45°. Depending on the other dimensions of the housing 1 or the dimensions of the receiving chamber 3, the height of the circumferential edge 10 has an elevation in the range of 0.1 to 1 mm. In the illustrated exemplary embodiment of the housing 1, the circumferential edge 10 has, by way of example, a height of 0.15 mm.

The illustrated exemplary embodiment of the housing 1 is preferably used for a rotational speed sensor. In this case, the receiving chamber 3 and the interior chamber 9 receive at least one electronic component of the rotational speed sensor, for example an ASIC component (ASIC: Application Specific Integrated Circuit), which is protected by the hardened potting compound 18.

The invention claimed is:

1. A housing assembly, comprising: a housing defining (i) an open receiving chamber (3) having an open upper side, and (ii) an enclosed interior chamber, the housing having a circumferential edge which acts as a creep barrier at a creep barrier at the open upper side; and a potting compound positioned in the open receiving chamber and the enclosed interior chamber, wherein the potting compound forms a concave surface with respect to the circumferential edge at the open upper side, wherein the open receiving chamber defines, at one end, an opening to the enclosed interior chamber which adjoins the open receiving chamber, wherein the open upper side of the open receiving chamber has different heights at the transition to the enclosed interior chamber that define a height difference, wherein the circumferential edge has (i) an outward descending slope, and (ii) a continuous curvature formed by tangential transitions so as to overcome the height difference, and wherein the circumferential edge enables temporary overfilling of the open receiving chamber during a potting process thereby forming a stable convex potting compound surface.

2. The housing assembly as claimed in claim 1, wherein edges of the open receiving chamber are designed to be rounded in the rising direction.

3. The housing assembly as claimed in claim 2, wherein the open receiving chamber has a rectangular base area with rounded corner regions.

4. The housing assembly as claimed in claim 1, wherein the outward descending slope has an angle of inclination in the range of 20° to 70°.

5. The housing assembly as claimed in claim 1, wherein the circumferential edge has a height in the range of 0.1 mm to 1.0 mm.

6. The housing assembly as claimed in claim 1, wherein the open receiving chamber and/or the interior chamber is configured to receive at least one electronic or electrical component which is protected by the potting compound.

7. The housing assembly as claimed in claim 1, wherein the opening of the open receiving chamber is designed to be partially circular and/or elliptical and/or stepped.

8. A sensor having a housing assembly and at least one electronic or electrical component arranged in the housing assembly, wherein the housing assembly is designed as claimed in claim 1.

9. A method for potting an open receiving chamber of a housing assembly, which is designed as claimed in claim 1, comprising:

(a) adding potting compound into the open receiving chamber; and (b) hardening the added potting compound, wherein step (a) includes adding the potting compound to the open receiving chamber until the open receiving chamber is full and a stable convex potting compound surface is formed at the circumferential edge of the open upper side, further comprising, prior to step (b), spreading the potting compound into the enclosed interior chamber via the opening, so that a concave potting compound surface forms at the circumferential edge of the open upper side of the open receiving chamber.

10. The method as claimed in claim 9, wherein the potting compound, after step (b), fills the enclosed interior chamber and forms a concave potting compound surface at the circumferential edge of the open upper side of the open receiving chamber.

* * * * *